United States Patent
Sato et al.

(10) Patent No.: US 8,709,170 B2
(45) Date of Patent: Apr. 29, 2014

(54) SUPERCRITICAL DRYING METHOD FOR SEMICONDUCTOR SUBSTRATE

(75) Inventors: Yohei Sato, Yokohama (JP); Hisashi Okuchi, Yokohama (JP); Hiroshi Tomita, Yokohama (JP); Hidekazu Hayashi, Yokohama (JP); Yukiko Kitajima, Komatsu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 303 days.

(21) Appl. No.: 13/052,232

(22) Filed: Mar. 21, 2011

(65) Prior Publication Data
US 2012/0118332 A1   May 17, 2012

(30) Foreign Application Priority Data
Nov. 15, 2010  (JP) ................... 2010-254922

(51) Int. Cl.
*B08B 7/00* (2006.01)
*B08B 7/04* (2006.01)
*B08B 3/00* (2006.01)

(52) U.S. Cl.
USPC .......... 134/30; 134/19; 134/26; 134/31

(58) Field of Classification Search
USPC ............ 134/26, 30, 19, 31; 34/417, 423
See application file for complete search history.

(56) References Cited

U.S. PATENT DOCUMENTS 5,700,379 A * 12/1997 Biebl .................. 216/2
6,524,379 B2 * 2/2003 Nohr et al. ............... 106/31.49
6,703,316 B2 * 3/2004 Inoue et al. ................ 438/710
8,372,212 B2 * 2/2013 Sato et al. ................. 134/26

(Continued)

FOREIGN PATENT DOCUMENTS

JP  2001176837 A * 6/2001
JP  2002-33302       1/2002

(Continued)

OTHER PUBLICATIONS

H. Hayashi et al., "Supercritical Drying Method," U.S. Appl. No. 12/976,593, filed Dec. 22, 2010.

(Continued)

*Primary Examiner* — Alexander Markoff
(74) *Attorney, Agent, or Firm* — Finnegan, Henderson, Farabow, Garrett & Dunner, L.L.P.

(57) ABSTRACT

In one embodiment, after rinsing a semiconductor substrate having a fine pattern formed thereon with pure water, the pure water staying on the semiconductor substrate is substituted with a water soluble organic solvent, and then, the semiconductor substrate is introduced into a chamber in a state wet with the water soluble organic solvent. Then, the water soluble organic solvent is turned into a supercritical state by increasing a temperature inside of the chamber. Thereafter, the inside of the chamber is reduced in pressure while keeping the inside of the chamber at a temperature enough not to liquefy the pure water (i.e., rinsing pure water mixed into the water soluble organic solvent), and further, the water soluble organic solvent in the supercritical state is changed into a gaseous state, to be discharged from the chamber, so that the semiconductor substrate is dried.

6 Claims, 5 Drawing Sheets

(56) References Cited

U.S. PATENT DOCUMENTS

| | | | |
|---|---|---|---|
| 2002/0184788 A1* | 12/2002 | Kawakami et al. | 34/282 |
| 2003/0019578 A1* | 1/2003 | Iwata et al. | 156/345.22 |
| 2003/0177659 A1* | 9/2003 | Saito et al. | 34/330 |
| 2003/0183251 A1* | 10/2003 | Kawakami et al. | 134/34 |
| 2004/0035021 A1* | 2/2004 | Arena-Foster et al. | 34/282 |
| 2004/0038532 A1* | 2/2004 | Kawakami et al. | 438/689 |
| 2005/0051930 A1* | 3/2005 | Kawakami et al. | 264/341 |
| 2009/0311874 A1* | 12/2009 | Tomita et al. | 438/759 |
| 2011/0000507 A1 | 1/2011 | Toshima et al. | |
| 2012/0247516 A1* | 10/2012 | Sato et al. | 134/26 |
| 2013/0055584 A1* | 3/2013 | Sato et al. | 34/417 |

FOREIGN PATENT DOCUMENTS

| | | |
|---|---|---|
| JP | 2003-92240 | 3/2003 |
| JP | 2004-335988 | 11/2004 |
| JP | 2004327894 A * | 11/2004 |
| KR | 2010128123 A * | 12/2010 |

OTHER PUBLICATIONS

Notification of Reason for Rejection issued by the Japanese Patent Office on Jan. 7, 2014, for Japanese Patent Application No. 2010-254922, and English-language translation thereof.

* cited by examiner

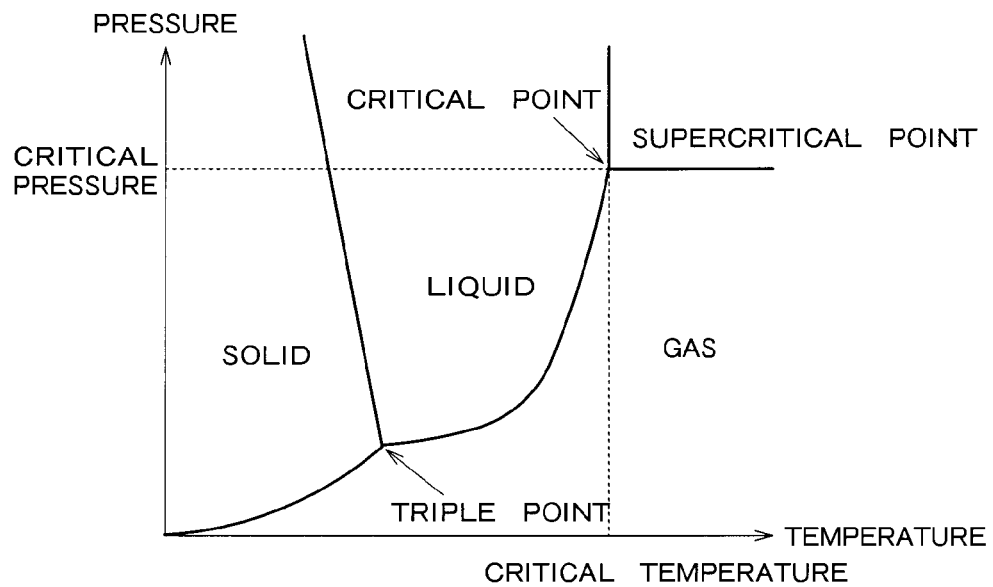
F I G. 1
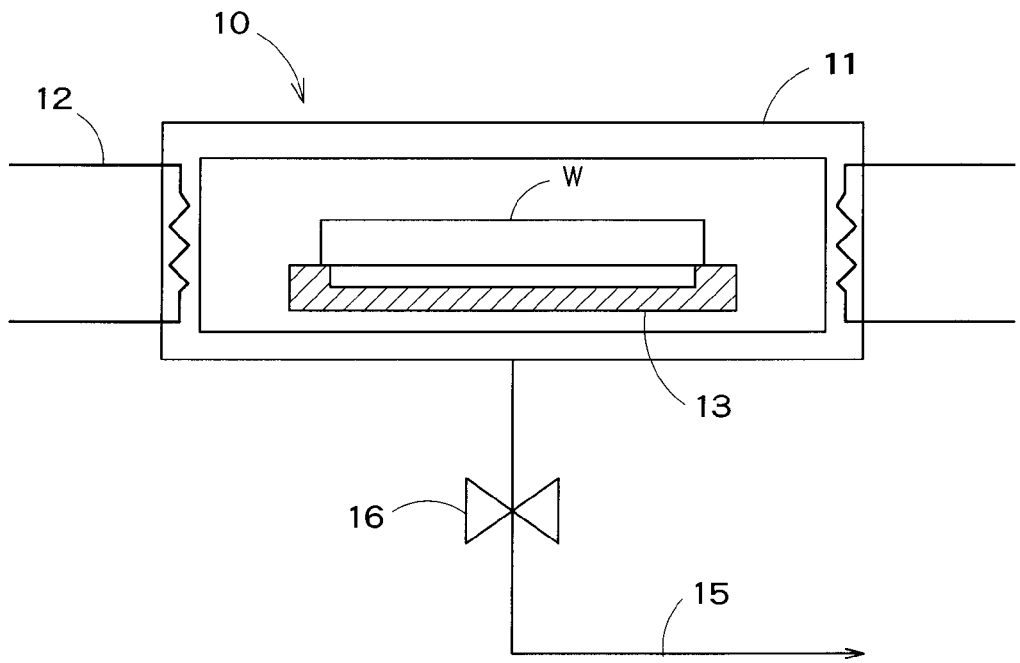
F I G. 2

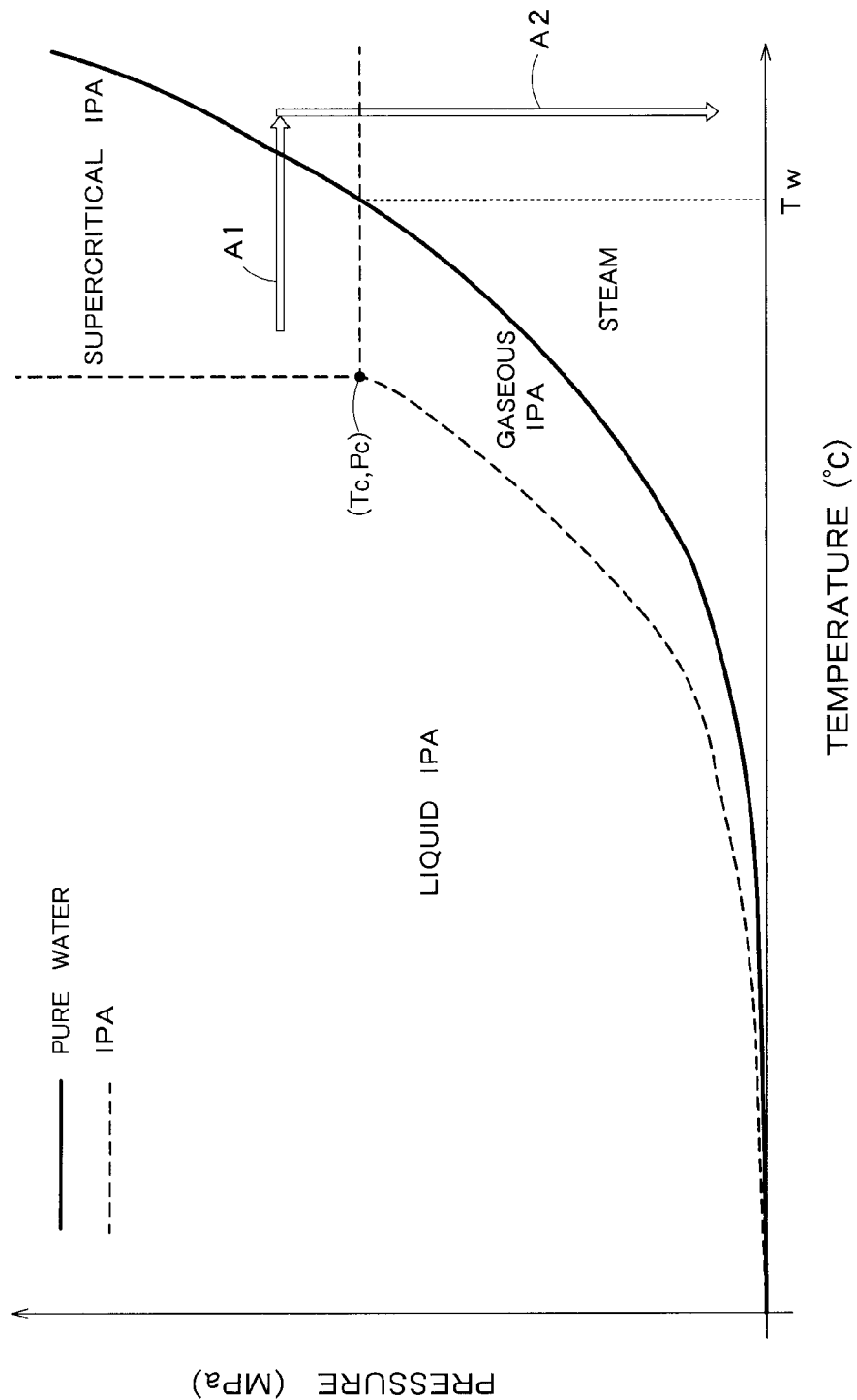
F I G. 4

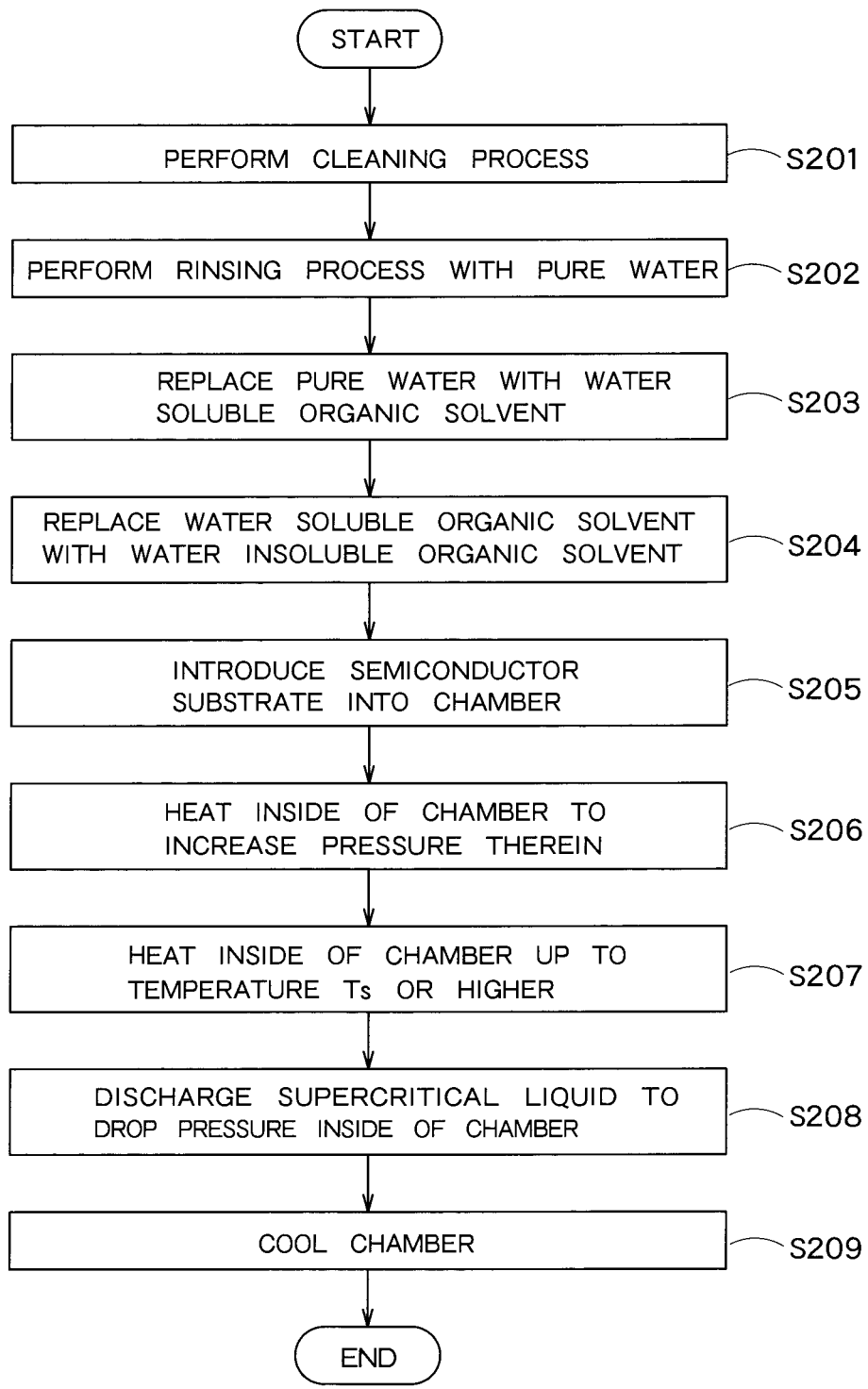
F I G. 5

SUPERCRITICAL DRYING METHOD FOR SEMICONDUCTOR SUBSTRATE

CROSS REFERENCE TO RELATED APPLICATIONS

This application is based upon and claims the benefit of priority from the prior Japanese Patent Application No. 2010-254922, filed on Nov. 15, 2010, the entire contents of which are incorporated herein by reference.

FIELD

Embodiments described herein relate generally to a supercritical drying method for semiconductor substrate.

BACKGROUND

Processes for fabricating a semiconductor device variously include a lithography process, an etching process, an ion implantation process, and the like. After completion of one process and before transfer to the following process, cleaning and drying processes for removing impurities or residues remaining on a wafer and cleaning the surface of the wafer are carried out.

In, for example, a wafer cleaning process after an etching process, a chemical solution for cleaning is supplied to the surface of the wafer, and thereafter, pure water is supplied, followed by a rinsing process. After the rinsing process, the pure water remaining on the wafer is removed, followed by a drying process for drying the wafer.

As a method for the drying process has been known, for example, a method for drying a wafer by substituting the pure water remaining on the wafer with isopropyl alcohol (IPA). However, there has arisen an issue of a collapse of a pattern formed on the wafer due to surface tension of a liquid during the drying process.

In order to solve the above-described issue, supercritical drying under surface tension of zero has been proposed. For example, a wafer whose surface is wet with IPA is immersed in carbon dioxide (a supercritical $CO_2$ fluid) in a supercritical state inside of a chamber, so that IPA on the wafer is dissolved in the supercritical $CO_2$ fluid. Then, the supercritical $CO_2$ fluid having IPA dissolved therein is gradually discharged from the chamber. Thereafter, the inside of the chamber is reduced in pressure and temperature, and then, the supercritical $CO_2$ fluid is changed to a gaseous phase, to be discharged outside of the chamber. Consequently, the wafer is dried.

However, there has arisen an issue that when carbon dioxide is changed from the supercritical phase to the gaseous phase by reducing the pressure inside of the chamber, IPA remaining inside of the chamber in the state dissolved in the supercritical $CO_2$ fluid is coagulated and adsorbed again on the wafer, thereby producing particles (drying stains). Moreover, in order to satisfactorily discharge IPA dissolved in the supercritical $CO_2$ fluid from the inside of the chamber, the supercritical $CO_2$ fluid is necessarily continued to be supplied to the chamber, and further, the supercritical $CO_2$ fluid having IPA dissolved therein is necessarily continued to be gradually discharged in a small quantity, thereby raising an issue that a time required for the drying process becomes longer.

BRIEF DESCRIPTION OF THE DRAWINGS

FIG. 1 is a graph illustrating the interrelationship among a pressure, a temperature, and the phase of substance;

FIG. 2 is a diagram schematically illustrating a supercritical drying device in a first embodiment according to the present invention;

FIG. 4 is a graph illustrating a steam pressure curve in the relationship between a water soluble organic solvent and pure water;

FIG. 5 is a flowchart illustrating a supercritical drying method in a second embodiment according to the present invention.

DETAILED DESCRIPTION

Figure 3:
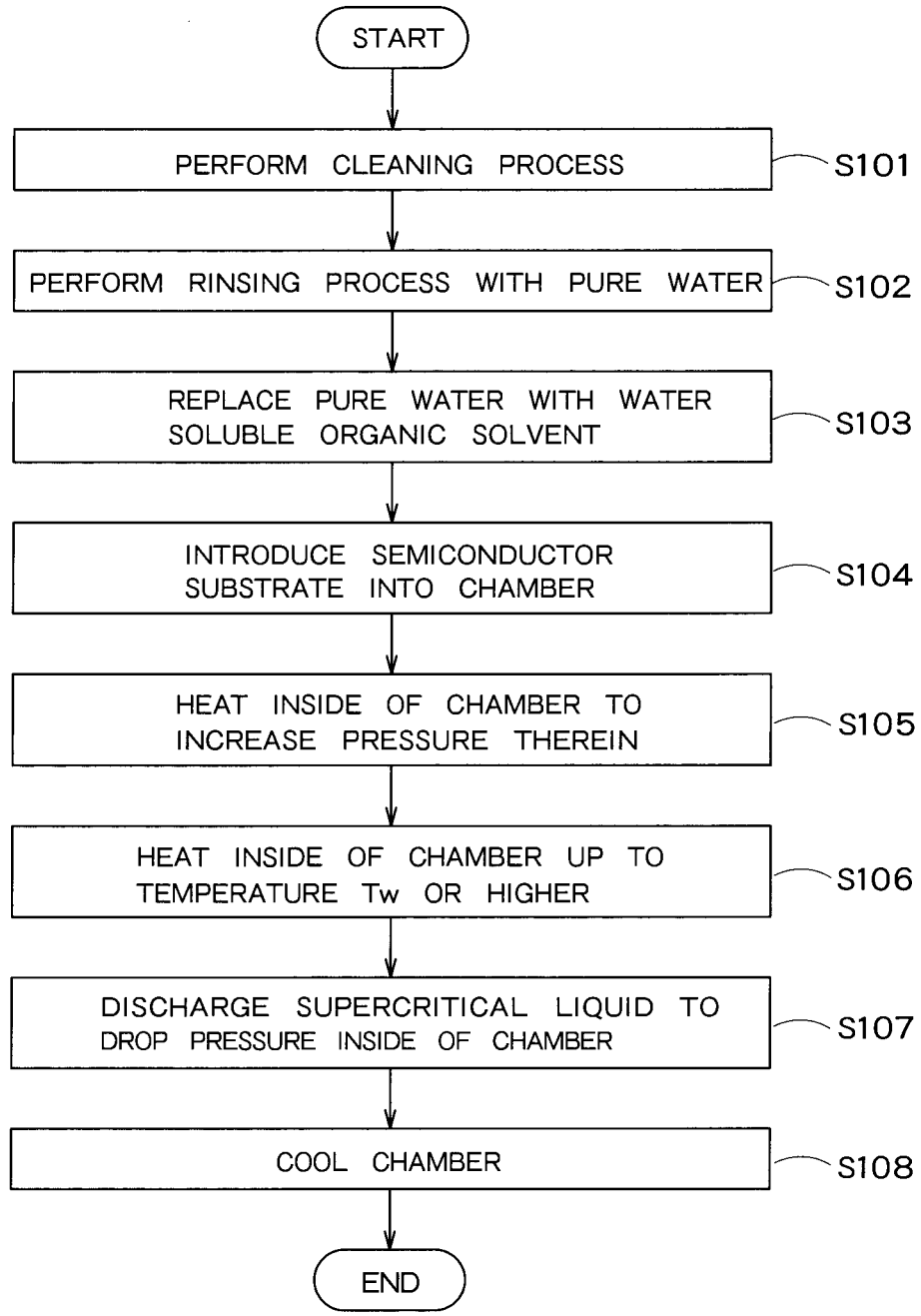
FIG. 3 is a flowchart illustrating a supercritical drying method in the first embodiment according to the present invention.

In one embodiment, after rinsing a semiconductor substrate having a fine pattern formed thereon with pure water, the pure water staying on the semiconductor substrate is substituted with a water soluble organic solvent, and then, the semiconductor substrate is introduced into a chamber in a state wet with the water soluble organic solvent. Then, the water soluble organic solvent is turned into a supercritical state by increasing a temperature inside of the chamber. Thereafter, the inside of the chamber is reduced in pressure while keeping the inside of the chamber at a temperature enough not to liquefy the pure water (i.e., rinsing pure water mixed into the water soluble organic solvent), and further, the water soluble organic solvent in the supercritical state is changed into a gaseous state, to be discharged from the chamber, so that the semiconductor substrate is dried.

Embodiments will be described below with reference to the attached drawings.

First Embodiment

First, a description will be given on supercritical drying. FIG. 1 is a graph illustrating the interrelationship among a pressure, a temperature, and the phase of substance. The functional substance of a supercritical fluid for use in the supercritical drying is present in three phases: a gaseous phase (gas); a liquid phase (a liquid); and a solid phase (a solid).

As illustrated in FIG. 1, the above-described three phases are partitioned by a steam pressure curve (i.e., a gaseous phase equilibrium line) indicating the boundary between the gaseous phase and the liquid phase, a sublimation curve indicating the boundary between the gaseous phase and the solid phase, and a dissolution curve indicating the boundary between the solid phase and the liquid phase. A triple point is referred to as a point at which the three phases overlap. When the steam pressure curve extends toward a high temperature side from the triple point, the curve reaches a critical point indicating a limit at which the gaseous phase and the liquid phase coexist. The gaseous phase and the liquid phase are equal in density at this critical point, and therefore, an interface on which gas and liquid coexist is dissipated.

At temperatures and pressures higher than those at the critical point, the gaseous phase and the liquid phase are not distinguished from each other, so that substance is turned into a supercritical fluid. The supercritical fluid is a fluid compressed densely at a temperature higher than a critical temperature. The supercritical fluid is similar to gas from the viewpoint in which the diffusion force of solvent molecules is dominant. At the same time, the supercritical fluid is similar to a liquid from the viewpoint in which an influence by coagulation force of the molecules should be considered, and therefore, the supercritical fluid has a property capable of dissolving various kinds of substances.

In addition, the supercritical fluid has a much higher infiltration property than that of a liquid, and has the characteristics capable of readily penetrating even a fine structure.

Furthermore, the supercritical fluid can be dried in such a manner as to be transited from the supercritical state directly to the gaseous phase to prevent any presence of the interface between the gas and the liquid, that is, to prevent capillary force (surface tension) from acting. Thus, drying without breaking a fine structure can be achieved. Supercritical drying is to dry a substrate by utilizing the supercritical state of the supercritical fluid.

Next, referring to FIG. 2, a description will be given of a supercritical drying device for supercritically drying a semiconductor substrate. As illustrated in FIG. 2, a supercritical drying device 10 is provided with a chamber 11 incorporating a heater 12 therein. The chamber 11 is a high pressure vessel made of SUS or the like. The heater 12 can adjust the temperature inside of the chamber 11. FIG. 2 illustrates the configuration in which the heater 12 is incorporated inside of the chamber 11, and the heater 12 may be disposed at the outer peripheral portion of the chamber 11.

Inside of the chamber 11 is housed a stage 13 formed of a ring-like flat plate for holding therein a semiconductor substrate W which is to be subjected to a supercritical drying process.

To the chamber 11 is connected a pipeline 15, through which gas or a supercritical fluid staying inside of the chamber 11 can be discharged to the outside. On the pipeline 15 is disposed a control valve 16 for adjusting the valve opening degree while monitoring and controlling a pressure inside of the chamber 11. The closure of the control valve 16 leads to a closely sealed state inside of the chamber 11.

Next, referring to a flowchart of FIG. 3, a description will be given of methods for cleaning and drying the semiconductor substrate in the present embodiment.

(Step S101) A semiconductor substrate to be processed is delivered to a cleaning chamber, not illustrated. Then, a chemical solution is supplied onto the semiconductor substrate, followed by cleaning. As the chemical solution may include a sulfuric acid, a fluoric acid, a hydrochloric acid, hydrogen peroxide, and the like.

Here, the cleaning process includes peeling a resist from the semiconductor substrate, removing particles or metallic impurities, etching and removing a film formed on the substrate, and the like. A fine pattern is formed on the semiconductor substrate. The fine pattern may be formed before the cleaning process or may be formed during the cleaning process.

(Step S102) After the cleaning process in step S101, rinsing with pure water is carried out such that the pure water is supplied onto the semiconductor substrate, and then, the chemical solution remaining on the semiconductor substrate is rinsed with the pure water.

(Step S103) After the rinsing process with the pure water in step S102, liquid replacing is carried out such that the semiconductor substrate wet thereon with the pure water is immersed in a water soluble organic solvent, and thus, the pure water on the semiconductor substrate is replaced with the water soluble organic solvent.

The water soluble organic solvent used herein may be, for example, alcohol such as isopropyl alcohol (IPA) or ketone which is higher in steam pressure than the pure water (i.e., lower in boiling point). Hereinafter, a description will be given of the case where IPA is used as the water soluble organic solvent.

Incidentally, it is construed that in the liquid replacing process, the semiconductor substrate is wet thereon with IPA, which includes the pure water (although in a small quantity) in mixture.

(Step S104) After the liquid replacing process in step S103, the semiconductor substrate is delivered out of the cleaning chamber in the state in which it is kept wet thereon with IPA but is not naturally dried. Thereafter, the semiconductor substrate is introduced to the chamber 11 illustrated in FIG. 2, and then, is fixed onto the stage 13. After that, the control valve 16 is closed, and thus, the inside of the chamber 11 is tightly closed.

(Step S105) IPA covering the surface of the semiconductor substrate is heated inside of the chamber 11 tightly closed by using the heater 12. An increase in IPA vaporized with the heat increases pressure inside of the chamber 11, which has a predetermined volume owing to the tight closure, in accordance with a steam pressure curve of IPA indicated by a broken line in FIG. 4.

Here, the actual pressure inside of the chamber 11 is equal to the sum of partial pressures of all of gaseous molecules present inside of the chamber 11. However, in the present embodiment, the partial pressure of gaseous IPA is regarded as the pressure inside of the chamber 11.

As illustrated in FIG. 4, when IPA is heated above a critical temperature Tc in the state in which the pressure inside of the chamber 11 reaches a critical pressure Pc of IPA, IPA (gaseous IPA and liquid IPA) inside of the chamber 11 is turned to a supercritical state. In this manner, the chamber 11 is filled with supercritical IPA (i.e., IPA in a supercritical state), and thus, the semiconductor substrate is covered with the supercritical IPA.

Incidentally, until IPA is turned into the supercritical state, the gaseous IPA and the liquid IPA are made coexist inside of the chamber 11 such that all of the liquid IPA covering the surface of the semiconductor substrate is not vaporized, that is, the semiconductor substrate is wet with the liquid IPA.

A temperature Tc, a pressure Pc, and the volume of the chamber 11 are substituted into a gas state equation ($PV=nRT$, wherein P designates a pressure; V, a volume; n, the number of moles; R, a gas constant; and T, the temperature), so that the amount nc (mol) of IPA present in the gaseous state inside of the chamber 11 can be obtained when IPA is turned into the supercritical state.

Consequently, the liquid IPA need be present in nc (mol) or more inside of the chamber 11 before the heating is started in step S105. In the case where the amount of IPA on the semiconductor substrate to be introduced into the chamber 11 is less than nc (mol), the liquid IPA is supplied into the chamber 11 from a chemical solution supplying unit, not illustrated, so that the liquid IPA can be present in nc (mol) or more inside of the chamber 11.

As the heating proceeds in step S105, the pure water staying on the semiconductor substrate in mixture with the liquid IPA is being vaporized, and therefore, the partial pressure of the pure water is increased in accordance with the steam pressure curve of the pure water indicated by a solid line in FIG. 4. The pure water is present in the gaseous state (i.e., the steam) in the amount based on the temperature inside of the chamber 11, the steam pressure of the pure water at that time, and the volume of the chamber 11, and further, in the liquid state in the residual amount. Since the pure water mixed into the liquid IPA is small in quantity, all or most of the pure water is construed to be turned into the steam.

(Step S106) After IPA is turned into the supercritical state in step S105, the inside of the chamber 11 is further heated by using the heater 12, and thus, it is increased up to a predetermined temperature Tw or higher (see an arrow A1 in FIG. 4). The temperature Tw is the temperature of the pure water (i.e., a boiling point) when a saturated steam pressure becomes the critical pressure Pc of IPA. The critical pressure Pc of IPA is about 5.4 MPa, and therefore, the temperature Tw becomes about 270° C. At this time, all of the pure water staying inside of the chamber 11 is present as the steam.

(Step S107) After heating in step S106, the supercritical IPA staying inside of the chamber 11 is discharged by opening the control valve 16, and thus, the inside of the chamber 11 is reduced in pressure (see an arrow A2 in FIG. 4). At this time, the temperature inside of the chamber 11 is kept at the predetermined temperature Tw or higher.

When the pressure inside of the chamber 11 becomes the critical pressure Pc or lower of IPA, the phase of IPA is changed from the supercritical fluid to gas. Since the temperature inside of the chamber 11 is set at Tw or higher, the pure water is kept gaseous even after the phase of IPA is changed, thereby preventing reliquefaction.

(Step S108) After the pressure inside of the chamber 11 is decreased down to the atmospheric pressure, the chamber 11 is cooled, and then, the semiconductor substrate is delivered out of the chamber 11.

Alternatively, after the pressure inside of the chamber 11 is decreased down to the atmospheric pressure, the semiconductor substrate at a high temperature may be transported to a cooling chamber, not illustrated, as it is, followed by cooling. In this case, the chamber 11 can be kept at a certain high temperature all the time, thereby shortening the time required for drying the semiconductor substrate.

As described above, in the present embodiment, IPA covering the surface of the semiconductor substrate is changed from the liquid IPA to the supercritical IPA, and thereafter, the supercritical IPA inside of the chamber 11 is dried in such a manner as to be directly changed in phase to the gaseous IPA. Consequently, no capillary (i.e., the surface tension) acts on the fine pattern formed on the semiconductor substrate, and therefore, the semiconductor substrate can be dried without breaking the fine pattern.

Moreover, when the pressure inside of the chamber 11 is decreased so that the supercritical IPA is changed in phase to the gaseous IPA, the temperature inside of the chamber 11 is set to a value at which the steam pressure of the pure water becomes higher than the critical pressure of IPA, and thus, the pure water staying inside of the chamber 11 is kept gaseous (i.e., the steam), to be prevented from being turned into a liquid state. In this manner, the steam inside of the chamber 11 is liquefied to be adsorbed onto the semiconductor substrate, thus preventing particles (i.e., drying stains) from being produced.

In the present embodiment, IPA staying inside of the chamber 11 is heated to be turned into the supercritical state, and further, the pressure inside of the chamber 11 is decreased while keeping the temperature inside of the chamber 11 to Tw or higher, thereby drying the semiconductor substrate. In contrast, in the conventional supercritical drying method, the supercritical $CO_2$ fluid is continuously supplied to the chamber for a long period of time, and then, IPA on the semiconductor substrate and inside of the chamber is sufficiently dissolved, to be discharged little by little. IPA is sufficiently discharged from the chamber, and then, the pressure and temperature are decreased inside of the chamber. In the present embodiment, it is unnecessary to perform the process requiring a long period of time, in which the supercritical $CO_2$ fluid having IPA dissolved therein is discharged from the chamber little by little, unlike the conventional supercritical drying method, thus shortening the time required for the drying process.

In this manner, with the supercritical drying method for the semiconductor substrate in the present embodiment, it is possible to reduce the particles produced on the semiconductor substrate, and further, to shorten the time required for the drying process.

Although the description has been given of the example in which IPA is used as the water soluble organic solvent in the above-described first embodiment, the same process may be performed even in the case of use of a water soluble organic solvent other than IPA.

Additionally, although the temperature is increased up to Tw or higher inside of the chamber 11 in step S106, before the pressure inside of the chamber 11 is decreased in step S107 in the above-described first embodiment, the decrease in pressure and the increase in temperature inside of the chamber 11 may be achieved at the same time as long as the temperature inside of the chamber 11 may become Tw or higher when IPA is changed from the supercritical phase to the gaseous phase.

Second Embodiment

In the above-described first embodiment, after the semiconductor substrate is rinsed with the pure water (step S102), the pure water staying on the semiconductor substrate is replaced with the water soluble organic solvent (step S103), and then, the semiconductor substrate wet thereon with the water soluble organic solvent is introduced into the chamber 11 (step S104). In contrast, in the present embodiment, after the pure water staying on the semiconductor substrate is replaced with the water soluble organic solvent, the water soluble organic solvent staying on the semiconductor substrate is replaced with a water insoluble organic solvent before the semiconductor substrate is introduced into the chamber 11. It is possible to reduce the cost of the chamber 11 by using an uninflammable water insoluble organic solvent in comparison with the first embodiment in which the flammable water soluble organic solvent is used.

Referring to a flowchart of FIG. 5, a description will be given of methods for cleaning and drying a semiconductor substrate in the present embodiment. Here, steps S201, S202, and S203 in FIG. 5 are similar to steps S101, S102, and S103, respectively, and therefore, their descriptions will not be repeated below.

(Step S204) After the liquid replacing process in step S203, a liquid replacing process is performed in which the semiconductor substrate wet thereon with a water soluble organic solvent (i.e., IPA) is immersed in a water insoluble organic solvent so that IPA staying on the semiconductor substrate is replaced with the water insoluble organic solvent.

The water insoluble organic solvent has a higher steam pressure (i.e., a lower boiling point) than that of the water soluble organic solvent, and is exemplified by, for example, alcohol fluoride, hydrofluoroether (HFE such as AE-3000 ($CF_3CH_2OCF_2CHF_2$)), chlorofluorocarbon (CFC), hydrofluorocarbon (HFC), and perfluorocarbon (PFC). Hereinafter, a description will be given on the case where HFE is used as the water insoluble organic solvent.

The semiconductor substrate is wet thereon with HFE in the liquid replacing process. Here, HFE contains IPA in mixture, though in a small quantity.

(Step S205) After the liquid replacing process in step S204, the semiconductor substrate is delivered out of the cleaning chamber in the state in which it is kept wet thereon with HFE but is not naturally dried. Thereafter, the semiconductor substrate is introduced to the chamber 11 illustrated in FIG. 2, and then, is fixed onto the stage 13. After that, the control valve 16 is closed, and thus, the inside of the chamber 11 is tightly closed.

(Step S206) HFE covering the surface of the semiconductor substrate is heated by using the heater 12 inside of the chamber 11 tightly closed. An increase in HFE vaporized with the heat increases a pressure inside of the chamber 11, which has a predetermined volume owing to the tight closure, in accordance with a steam pressure curve of HFE indicated by a broken line in FIG. 6.

Here, the actual pressure inside of the chamber 11 is equal to the sum of partial pressures of all of gaseous molecules present inside of the chamber 11. However, in the present embodiment, the partial pressure of gaseous HFE is regarded as the pressure inside of the chamber 11.

Figure 6:
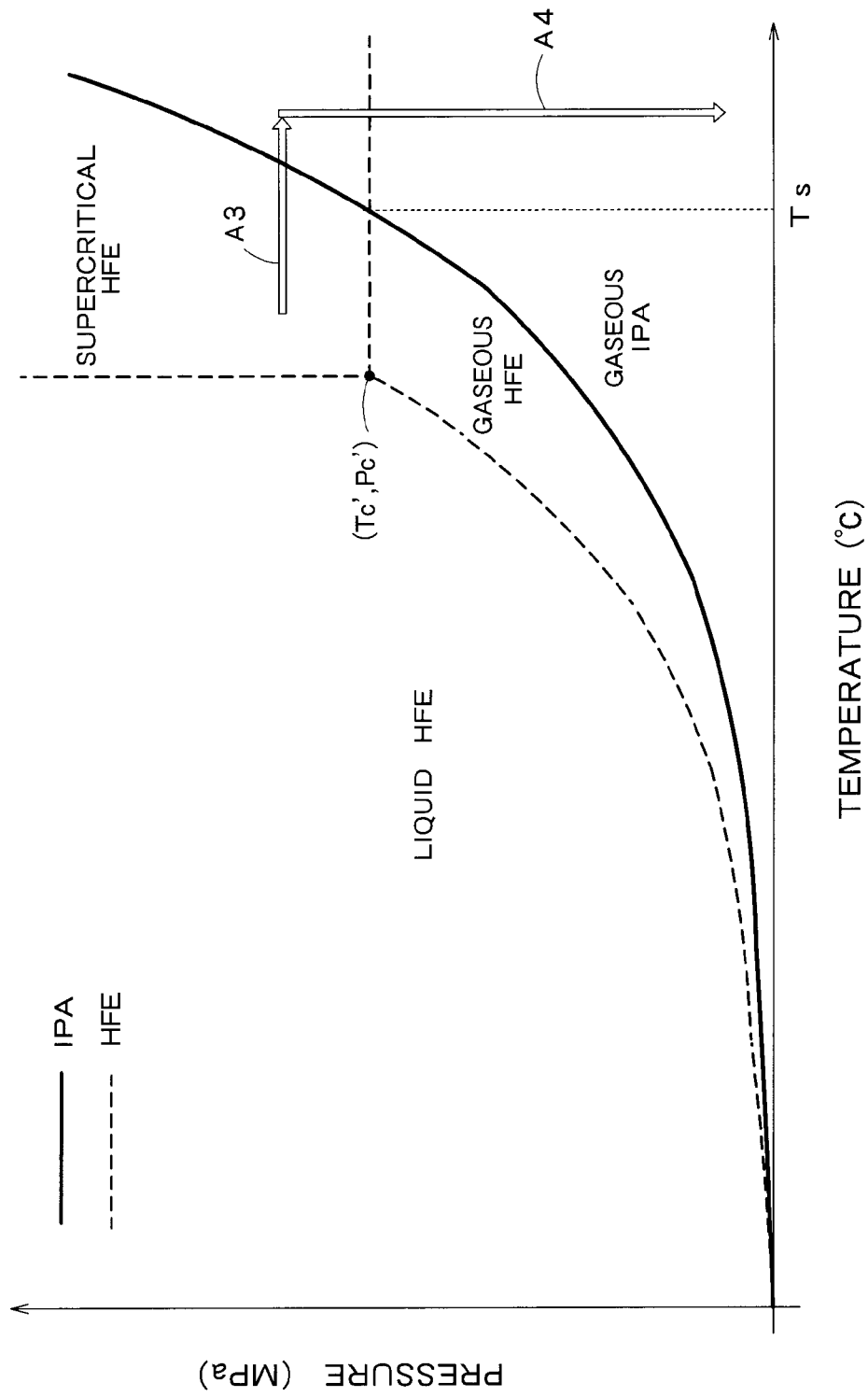
FIG. 6 is a graph illustrating a steam pressure curve in the relationship between a water soluble organic solvent and a water insoluble organic solvent.

As illustrated in FIG. 6, when HFE is heated above a critical temperature $Tc'$ in the state in which the pressure inside of the chamber 11 reaches a critical pressure $Pc'$ of HFE, HFE (gaseous HFE and liquid HFE) inside of the chamber 11 is turned to a supercritical state. In this manner, the chamber 11 is filled with supercritical HFE (i.e., HFE in a supercritical state), and thus, the semiconductor substrate is covered with the supercritical HFE.

Incidentally, until HFE is turned into the supercritical state, the gaseous HFE and the liquid HFE are made coexist inside of the chamber 11 such that all of the liquid HFE covering the surface of the semiconductor substrate is not vaporized, that is, the semiconductor substrate is wet with the liquid HFE.

A temperature $Tc'$, a pressure $Pc'$, and the volume of the chamber 11 are substituted into a gas state equation ($PV=nRT$, wherein P designates a pressure; V, a volume; n, the number of moles; R, a gas constant; and T, the temperature), so that the amount $nc'$ (mol) of HFE present in the gaseous state inside of the chamber 11 can be obtained when HFE is turned into the supercritical state.

Consequently, the liquid HFE need be present in $nc'$ (mol) or more inside of the chamber 11 before the heating is started in step S206. In the case where the amount of HFE on the semiconductor substrate to be introduced into the chamber 11 is less than $nc'$ (mol), the liquid HFE is supplied into the chamber 11 from a chemical solution supplying unit, not illustrated, so that the liquid HFE can be present in $nc'$ (mol) or more inside of the chamber 11.

As the heating proceeds in step S206, IPA staying on the semiconductor substrate in mixture with the liquid HFE also is being vaporized, and therefore, the partial pressure of IPA is increased in accordance with the steam pressure curve of IPA indicated by a solid line in FIG. 6. IPA is present in the gaseous state in the amount based on the temperature inside of the chamber 11, the steam pressure of IPA at that time, and the volume of the chamber 11, and further, in the liquid state in the residual amount. Since IPA mixed into the liquid HFE is small in quantity, all or most of IPA is construed to be turned into the gas.

(Step S207) After HFE is turned into the supercritical state in step S206, the inside of the chamber 11 is further heated by using the heater 12, and thus, it is increased up to a predetermined temperature Ts or higher (see an arrow A3 in FIG. 6). The temperature Ts is the temperature of IPA (i.e., a boiling point) when a steam pressure of IPA becomes the critical pressure $Pc'$ of HFE. The critical pressure $Pc'$ of HFE is about 2.4 MPa, and therefore, the temperature Ts becomes about 200° C. At this time, all of IPA staying inside of the chamber 11 is present as the gas.

(Step S208) After heating in step S207, the supercritical HFE staying inside of the chamber 11 is discharged by opening the control valve 16, and thus, the inside of the chamber 11 is reduced in pressure (see an arrow A4 in FIG. 6). At this time, the temperature inside of the chamber 11 is kept at the predetermined temperature Ts or higher.

When the pressure inside of the chamber 11 becomes the critical pressure $Pc'$ or lower, the phase of HFE is changed from the supercritical fluid to gas. Since the temperature inside of the chamber 11 is set at Ts or higher, IPA is kept gaseous even after the phase of HFE is changed, thereby preventing reliquefaction.

(Step S209) After the pressure inside of the chamber 11 is decreased down to the atmospheric pressure, the chamber 11 is cooled, and then, the semiconductor substrate is delivered out of the chamber 11.

Alternatively, after the pressure inside of the chamber 11 is decreased down to the atmospheric pressure, the semiconductor substrate at a high temperature may be transported to a cooling chamber, not illustrated, as it is, followed by cooling. In this case, the chamber 11 can be kept at a certain high temperature all the time, thereby shortening the time required for drying the semiconductor substrate.

As described above, in the present embodiment, FIFE covering the surface of the semiconductor substrate is changed from the liquid HFE to the supercritical HFE, and thereafter, the supercritical HFE inside of the chamber 11 is dried in such a manner as to be directly changed in phase to the gaseous HFE. Consequently, no capillary (i.e., the surface tension) acts on the fine pattern formed on the semiconductor substrate, and therefore, the semiconductor substrate can be dried without breaking the fine pattern.

Moreover, when the pressure inside of the chamber 11 is decreased so that the supercritical FIFE is changed in phase to the gaseous FIFE, the temperature inside of the chamber 11 is set to a value at which the steam pressure of IPA becomes higher than the critical pressure of HFE, and thus, IPA staying inside of the chamber 11 is kept gaseous, to be prevented from being turned into a liquid state. In this manner, the gaseous IPA inside of the chamber 11 is liquefied to be adsorbed onto the semiconductor substrate, thus preventing particles (i.e., drying stains) from being produced.

Moreover, in the present embodiment, HFE staying inside of the chamber 11 is heated to be turned into the supercritical state, and further, the pressure inside of the chamber 11 is decreased while keeping the temperature inside of the chamber 11 to Ts or higher, thereby drying the semiconductor substrate. In contrast, in the conventional supercritical drying method, the supercritical $CO_2$ fluid is continuously supplied to the chamber for a long period of time, and then, IPA on the semiconductor substrate and inside of the chamber is sufficiently dissolved, to be discharged little by little. IPA is sufficiently discharged from the chamber, and then, the pressure and temperature are decreased inside of the chamber. In the present embodiment, it is unnecessary to perform the process requiring a long period of time, in which the supercritical $CO_2$ fluid having IPA dissolved therein is discharged from the chamber little by little, unlike the conventional supercritical drying method, thus shortening the time required for the drying process.

In this manner, with the supercritical drying method for the semiconductor substrate in the present embodiment, it is possible to reduce the particles produced on the semiconductor substrate, and further, to shorten the time required for the drying process. Furthermore, it is possible to reduce the cost of the chamber 11 for use in drying.

Although the description has been given of the example in which IPA is used as the water soluble organic solvent and HFE is used as the water insoluble organic solvent in the above-described second embodiment, the same process may be performed even in the case of use of a water soluble organic solvent other than IPA and a water insoluble organic solvent other than HFE.

Although the temperature is increased up to Ts or higher inside of the chamber 11 in step S207, before the pressure inside of the chamber 11 is decreased in step S208 in the above-described second embodiment, the decrease in pressure and the increase in temperature inside of the chamber 11 may be achieved at the same time as long as the temperature inside of the chamber 11 may become Ts or higher when the HFE is changed from the supercritical phase to the gaseous phase.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A supercritical drying method for a semiconductor substrate, comprising:
    cleaning the semiconductor substrate with a chemical solution;
    rinsing the semiconductor substrate with pure water to cover a surface of the semiconductor substrate with the pure water after the cleaning;
    supplying a water soluble organic solvent onto the semiconductor substrate after the rinsing, to replace the pure water covering the surface of the semiconductor substrate with the water soluble organic solvent;
    introducing the semiconductor substrate into a chamber, the surface of the semiconductor substrate being covered with the water soluble organic solvent;
    increasing a temperature inside of the chamber up to a critical temperature of the water soluble organic solvent or higher, to turn the water soluble organic solvent into a supercritical state;
    after turning the water soluble organic solvent into the supercritical state, increasing a temperature inside of the chamber to turn pure water in the chamber into steam while maintaining the water soluble organic solvent in the supercritical state; and
    decreasing a pressure inside of the chamber while keeping a temperature inside of the chamber at a predetermined value at which the steam is not liquefied, to turn the water soluble organic solvent in the supercritical state into a gaseous state, thus discharging the water soluble organic solvent from the chamber.

2. The supercritical drying method for a semiconductor substrate according to claim 1, wherein the predetermined temperature is a temperature at which a steam pressure of the pure water becomes higher than a critical pressure of the water soluble organic solvent.

3. The supercritical drying method for a semiconductor substrate according to claim 2, wherein a steam pressure of the water soluble organic solvent is higher than that of the pure water.

4. The supercritical drying method for a semiconductor substrate according to claim 3, wherein the water soluble organic solvent includes alcohol or ketone.

5. The supercritical drying method according to claim 1, wherein before increasing the temperature inside of the chamber, the water soluble organic solvent is supplied into the chamber, and a quantity of the supplied water soluble organic solvent is obtained based on the critical temperature of the water soluble organic solvent, a steam pressure of the water soluble organic solvent at the critical temperature, and a volume of the chamber.

6. The supercritical drying method according to claim 5, wherein, in increasing the temperature inside of the chamber until the water soluble organic solvent is turned into the supercritical state, a gaseous water soluble organic solvent and a liquid water soluble organic solvent coexist inside of the chamber.

* * * * *